United States Patent
Chen et al.

(10) Patent No.: US 9,431,221 B2
(45) Date of Patent: Aug. 30, 2016

(54) PLASMA-PROCESSING APPARATUS WITH UPPER ELECTRODE PLATE AND METHOD FOR PERFORMING PLASMA TREATMENT PROCESS

(71) Applicant: Taiwan Semiconductor Manufacturing Co., Ltd, Hsin-Chu (TW)

(72) Inventors: Po-Ju Chen, Hsinchu (TW); Chih-Ching Cheng, Xizhou Township (TW); Hsin-Yi Tsai, Hsinchu (TW); Xiao-Meng Chen, Baoshan Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 128 days.

(21) Appl. No.: 14/325,767

(22) Filed: Jul. 8, 2014

(65) Prior Publication Data
US 2016/0013081 A1 Jan. 14, 2016

(51) Int. Cl.
| H01L 21/36 | (2006.01) |
| H01J 37/32 | (2006.01) |
| H01L 21/3065 | (2006.01) |
| H01L 21/311 | (2006.01) |
| H01L 21/3213 | (2006.01) |
| C23C 16/44 | (2006.01) |
| C23C 16/455 | (2006.01) |

(52) U.S. Cl.
CPC ..... *H01J 37/32559* (2013.01); *C23C 16/4404* (2013.01); *C23C 16/45563* (2013.01); *C23C 16/45565* (2013.01); *H01J 37/3244* (2013.01); *H01J 37/32495* (2013.01); *H01J 37/32807* (2013.01); *H01L 21/3065* (2013.01); *H01L 21/31116* (2013.01); *H01L 21/31138* (2013.01); *H01L 21/32136* (2013.01)

(58) Field of Classification Search
CPC .................. C23C 16/45563; C23C 16/45565; C23C 16/4404
USPC ........... 438/503, 507; 118/715, 723 E, 723 R
See application file for complete search history.

(56) References Cited

U.S. PATENT DOCUMENTS

| 5,449,410 A * | 9/1995 | Chang ............... H01J 37/32082 118/723 E |
| 6,182,603 B1 * | 2/2001 | Shang ................. C23C 16/4404 118/715 |
| 7,846,291 B2 * | 12/2010 | Otsuki .................... C23C 4/105 118/723 R |
| 2002/0129769 A1 * | 9/2002 | Kim .................. C23C 16/45514 118/723 E |
| 2007/0204147 A1 * | 8/2007 | Kobayashi ............ C23C 16/405 713/155 |

* cited by examiner

*Primary Examiner* — Kevin M Picardat
(74) *Attorney, Agent, or Firm* — Birch, Stewart, Kolasch & Birch, LLP

(57) ABSTRACT

A plasma-processing apparatus is provided. The plasma-processing apparatus includes a processing chamber having an upper portion and a lower portion. The upper portion has a gas inlet. The plasma-processing apparatus includes an upper electrode plate disposed in the upper portion. The upper electrode plate has gas holes passing through the upper electrode plate. The plasma-processing apparatus includes a protective layer disposed over inner walls of the gas holes. The protective layer and the upper electrode plate have different materials. The plasma-processing apparatus includes a lower electrode pedestal disposed in the lower portion for supporting a substrate.

20 Claims, 9 Drawing Sheets

PLASMA-PROCESSING APPARATUS WITH UPPER ELECTRODE PLATE AND METHOD FOR PERFORMING PLASMA TREATMENT PROCESS

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since the feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
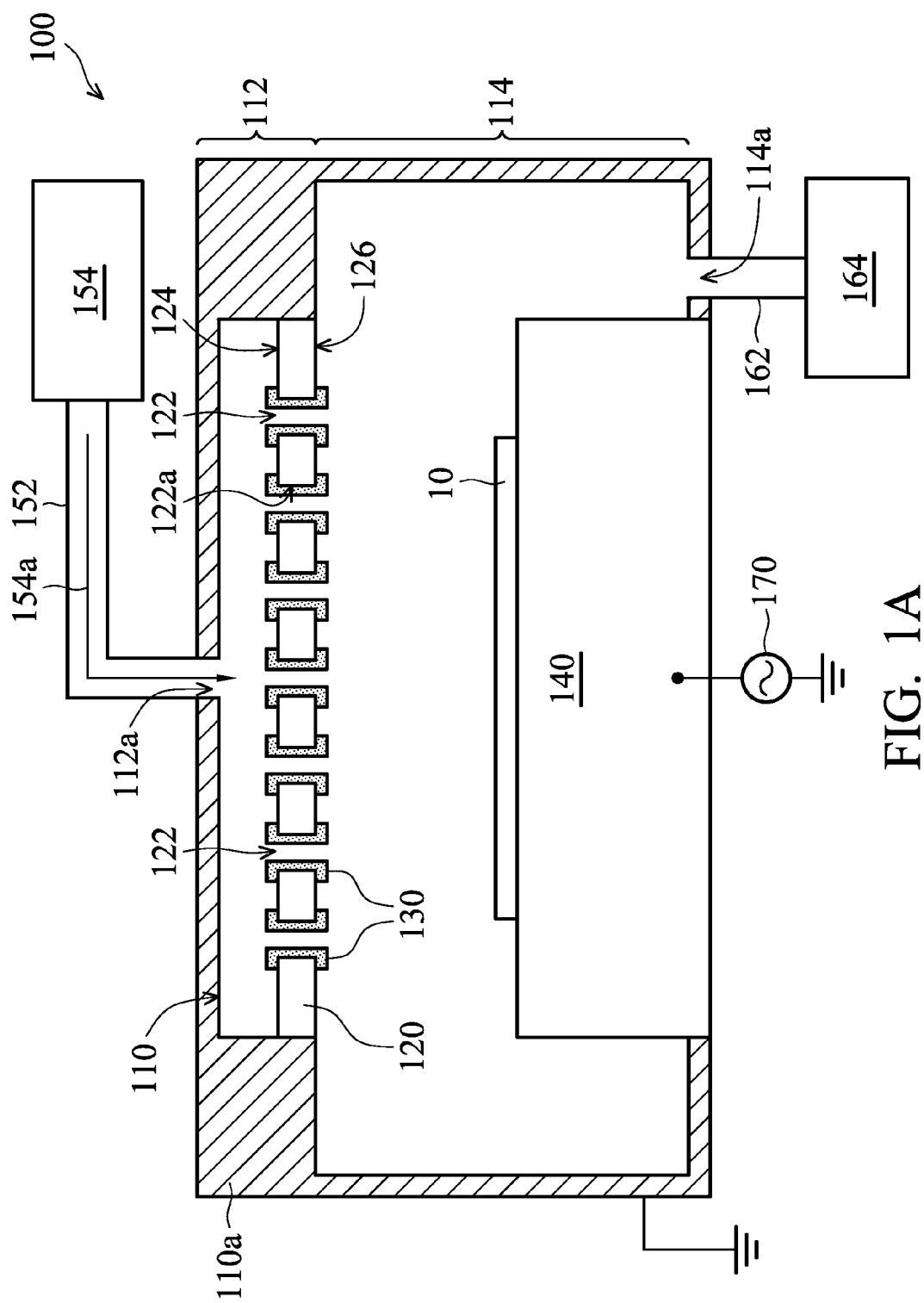
FIG. 1A is a cross-sectional view of a plasma-processing apparatus, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIG. 1A is a cross-sectional view of a plasma-processing apparatus, in accordance with some embodiments. As shown in FIG. 1A, a plasma-processing apparatus 100 is provided. In some embodiments, the plasma-processing apparatus 100 is a capacitively coupled plasma (CCP) reactor (or etcher). The plasma-processing apparatus 100 includes a processing chamber 110, an upper electrode plate 120, a protective layer 130, and a lower electrode pedestal 140, in accordance with some embodiments.

The processing chamber 110 is located in a housing 110a, in accordance with some embodiments. The processing chamber 110 has an upper portion 112 and a lower portion 114, in accordance with some embodiments. The upper portion 112 has a gas inlet 112a, in accordance with some embodiments.

In some embodiments, the plasma-processing apparatus 100 further includes a gas-supply pipe 152 and a processing gas-supply source 154. The gas-supply pipe 152 connects the processing gas-supply source 154 to the gas inlet 112a, in accordance with some embodiments. The processing gas-supply source 154 is configured to supply a processing gas 154a into the processing chamber 110, in accordance with some embodiments. The processing gas 154a includes fluorine, in accordance with some embodiments. In some embodiments, the processing gas 154a includes $CF_4$ (tetrafluoromethane), Ar, and $O_2$.

The upper electrode plate 120 is disposed in the upper portion 112, in accordance with some embodiments. In some embodiments, the housing 110a detachably supports the upper electrode plate 120. The upper electrode plate 120 has gas holes 122 passing through the upper electrode plate 120, in accordance with some embodiments.

The upper electrode plate 120 is configured to control the flow of the processing gas 154a through the gas holes 122, in accordance with some embodiments. The upper electrode plate 120 is also configured to serve as an upper electrode in a plasma process, in accordance with some embodiments.

The upper electrode plate 120 has a first surface 124 and a second surface 126 opposite to the first surface 124, in accordance with some embodiments. The upper electrode plate 120 includes conductive materials. The upper electrode plate 120 includes, for example, silicon or quartz.

The protective layer 130 is disposed over inner walls 122a of the gas holes 122, in accordance with some embodiments. The protective layer 130 is configured to protect the upper electrode plate 120 (especially the inner walls 122a of the gas holes 122) from being etched by the processing gas 154a and the plasma formed from the processing gas 154a, in accordance with some embodiments.

The protective layer 130 and the upper electrode plate 120 include different materials, in accordance with some embodiments. The protective layer 130 includes oxides, nitrides, carbides, or ceramic materials, in accordance with some embodiments. The protective layer 130 includes yttrium oxide, aluminum oxide, silicon nitride, or silicon carbide, in accordance with some embodiments. The protective layer 130 is formed by an electroless plating process, a sputtering process, a chemical vapor deposition (CVD) process, or another suitable process.

Figure 2A:
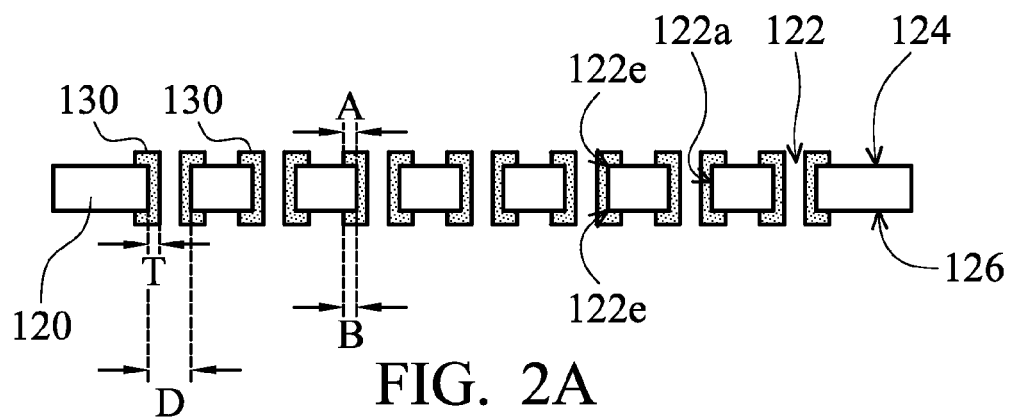
FIG. 2A is an enlarged cross-sectional view of the upper electrode plate and the protective layer of FIG. 1A, in accordance with some embodiments.
Figure 2B:
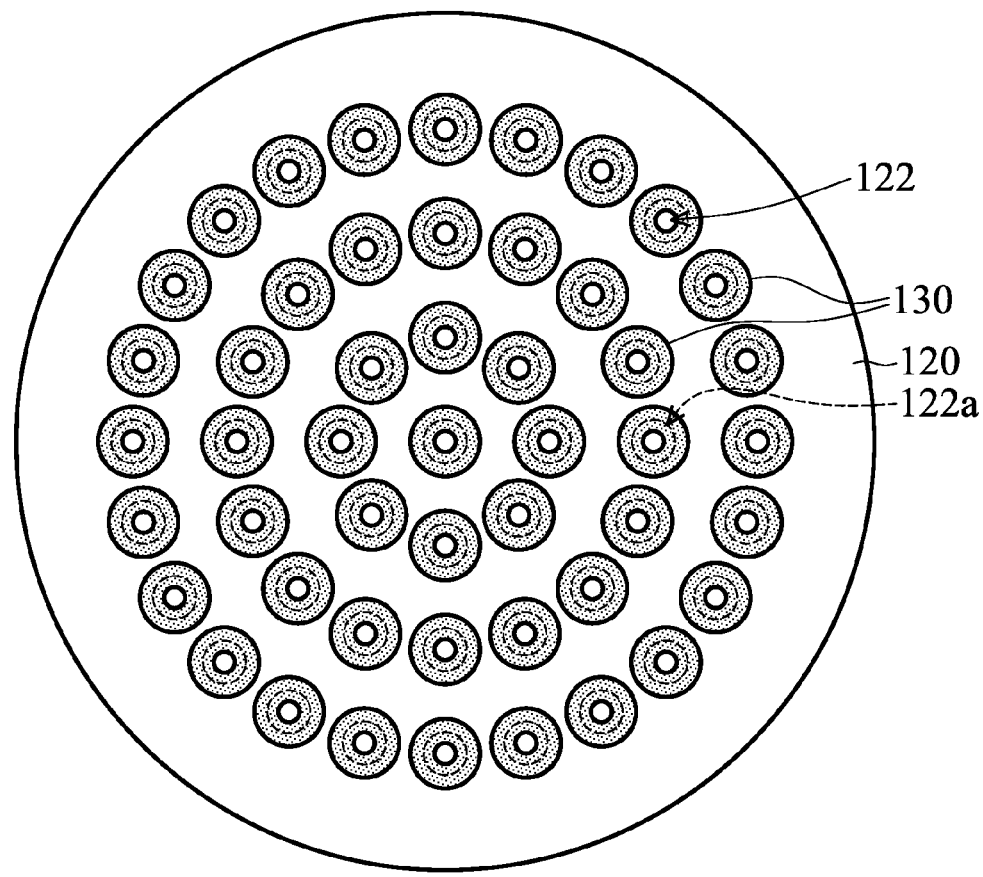
FIG. 2B is a bottom view of the upper electrode plate and the protective layer of FIG. 1A, in accordance with some embodiments.

FIG. 2A is an enlarged cross-sectional view of the upper electrode plate and the protective layer of FIG. 1A, in accordance with some embodiments. FIG. 2B is a bottom view of the upper electrode plate and the protective layer of FIG. 1A, in accordance with some embodiments.

In some embodiments, as shown in FIGS. 1A, 2A, and 2B, the protective layer 130 covers the inner walls 122a of the gas holes 122. The protective layer 130 covers the entirety of the inner walls 122a of the gas holes 122, in accordance with some embodiments. In some embodiments, a ratio of a thickness T of the protective layer 130 over the inner walls 122a to a diameter D of the gas hole 122 ranges from about 0.01 to about 0.4. If the ratio is less than 0.01, the protective layer 130 may be too thin to protect the inner walls 122a. If the ratio is greater than 0.4, the protective layer 130 may tend to block the gas holes 122.

In some embodiments, the protective layer 130 extends onto portions of the first surface 124 and the second surface 126 to protect the edges 122c of the gas holes 122. In some embodiments, as shown in FIG. 2A, the protective layer 130 over the first surface 124 has an extension length A, and the protective layer 130 over the second surface 126 has an extension length B. In some embodiments, a ratio (A/D) of the extension length A to the diameter D of the gas hole 122 ranges from about 0.01 to about 10.

In some embodiments, a ratio (B/D) of the extension length B to the diameter D of the gas hole 122 ranges from about 0.01 to about 10. Since the upper electrode plate 120 serves as an upper electrode (and may need to react with the plasma), the protective layer 130 may need to expose most of the second surface 126.

As shown in FIG. 1A, the lower electrode pedestal 140 is disposed in the lower portion 114, in accordance with some embodiments. The lower electrode pedestal 140 is configured to support a substrate 10 and serves as a lower electrode during a plasma process, in accordance with some embodiments. The lower electrode pedestal 140 may include an electrostatic chuck.

The substrate 10 includes, for example, a wafer. The wafer includes, for example, a silicon wafer. The upper electrode plate 120 is disposed above the lower electrode pedestal 140, in accordance with some embodiments. The first surface 124 of the upper electrode plate 120 faces away from the lower electrode pedestal 140, in accordance with some embodiments.

In some embodiments, as shown in FIG. 1A, the lower portion 114 has a gas outlet 114a. In some embodiments, the plasma-processing apparatus 100 further includes a gas exhaust pipe 162 and a gas exhaust unit 164. The gas exhaust pipe 162 connects the gas exhaust unit 164 to the gas outlet 114a, in accordance with some embodiments.

The gas exhaust unit 164 is configured to exhaust the processing gas 154a in the lower portion 114 and to depressurize the processing chamber 110, in accordance with some embodiments. The gas exhaust unit 164 includes, for example, a vacuum pump.

In some embodiments, as shown in FIG. 1A, the plasma-processing apparatus 100 further includes a high-frequency power supply 170. The high-frequency power supply 170 is electrically connected to the lower electrode pedestal 140. The high-frequency power supply 170 is configured to output high-frequency power (e.g., radio-frequency power) to the lower electrode pedestal 140, in accordance with some embodiments. The high-frequency power supply 170 may convert the processing gas 154a to plasma with a high-frequency discharge in the lower portion 114 of the processing chamber 110, in accordance with some embodiments.

In some embodiments, the upper electrode plate 120 is electrically grounded. In some other embodiments, the upper electrode plate 120 is electrically connected to a high-frequency power supply (not shown). In still other embodiments (not shown), the upper electrode plate 120 is electrically connected to a high-frequency power supply, and the lower electrode pedestal 140 is electrically grounded.

Figure 1B:
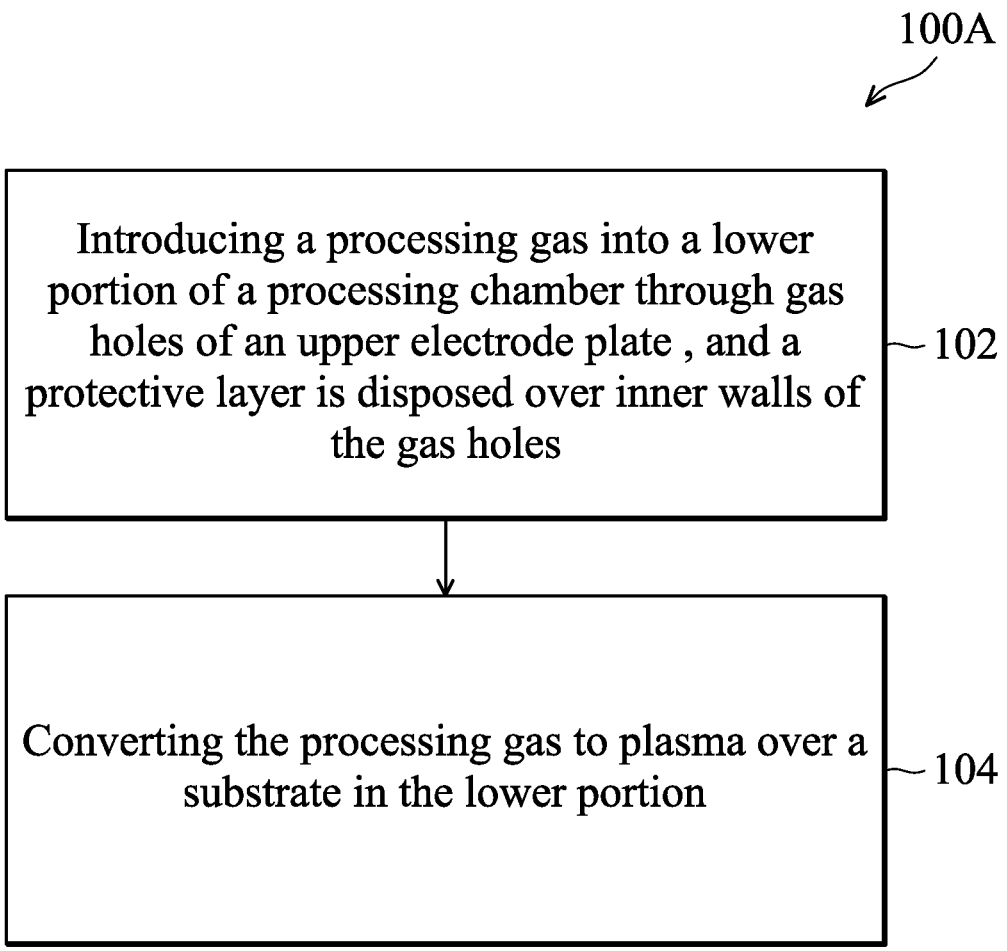
FIG. 1B is a flow chart illustrating a method for performing a plasma treatment process, in accordance with some embodiments.

FIG. 1B is a flow chart illustrating a method 100A for performing a plasma treatment process, in accordance with some embodiments. As shown in FIGS. 1A and 1B, the method 100A begins with an operation 102 in which the processing gas 154a is introduced into the lower portion 114 of the processing chamber 110 through the gas holes 122 of the upper electrode plate 120. The protective layer 130 is disposed over the inner walls 122a of the gas holes 122. The method 100A continues with an operation 104 in which the processing gas 154a is converted to plasma over the substrate 10 in the lower portion 114.

In some embodiments, as shown in FIG. 1A, in the plasma treatment process, the substrate 10 is loaded into the processing chamber 110 and mounted on the lower electrode pedestal 140. Then, the processing gas 154a (e.g., an etching gas) is introduced from the processing gas-supply source 154 into the processing chamber 110, in accordance with some embodiments. In some embodiments, the internal pressure of the processing chamber 110 is adjusted by the gas exhaust unit 164.

By turning on the high-frequency power supply 170, the high-frequency power is applied to the lower electrode pedestal 140, in accordance with some embodiments. The processing gas 154a passing through the gas holes 122 of the upper electrode plate 120 is excited (or converted) into plasma by a high-frequency discharge between the upper electrode plate 120 and the lower electrode pedestal 140, in accordance with some embodiments.

By radicals or ions contained in the plasma, an etching target film (not shown) on the substrate 10 is etched in a desired pattern, in accordance with some embodiments. The etching target film includes, for example, an oxide film. In some embodiments, the etching target film is etched to form vias passing through the etching target film.

The critical dimensions (CD) of the vias may be affected by the diameters D of the gas holes 122. Since the protective layer 130 protects the inner walls 122a of the gas holes 122 from being etched by the processing gas 154a and the plasma, the diameters D of the gas holes 122 may be maintained substantially the same during and after the etching processes. Therefore, the protective layer 130 may improve the yield of the etching processes and reduce lot-to-lot CD variation. Furthermore, the protective layer 130 may improve the lifetime of the upper electrode plate 120.

It should be noted that the protective layer 130 and the upper electrode plate 120 are not limited to the structures shown in FIGS. 1A, 2A, and 2B. Some variations of the protective layer 130 and the upper electrode plate 120 are described as follows.

Figure 3A:
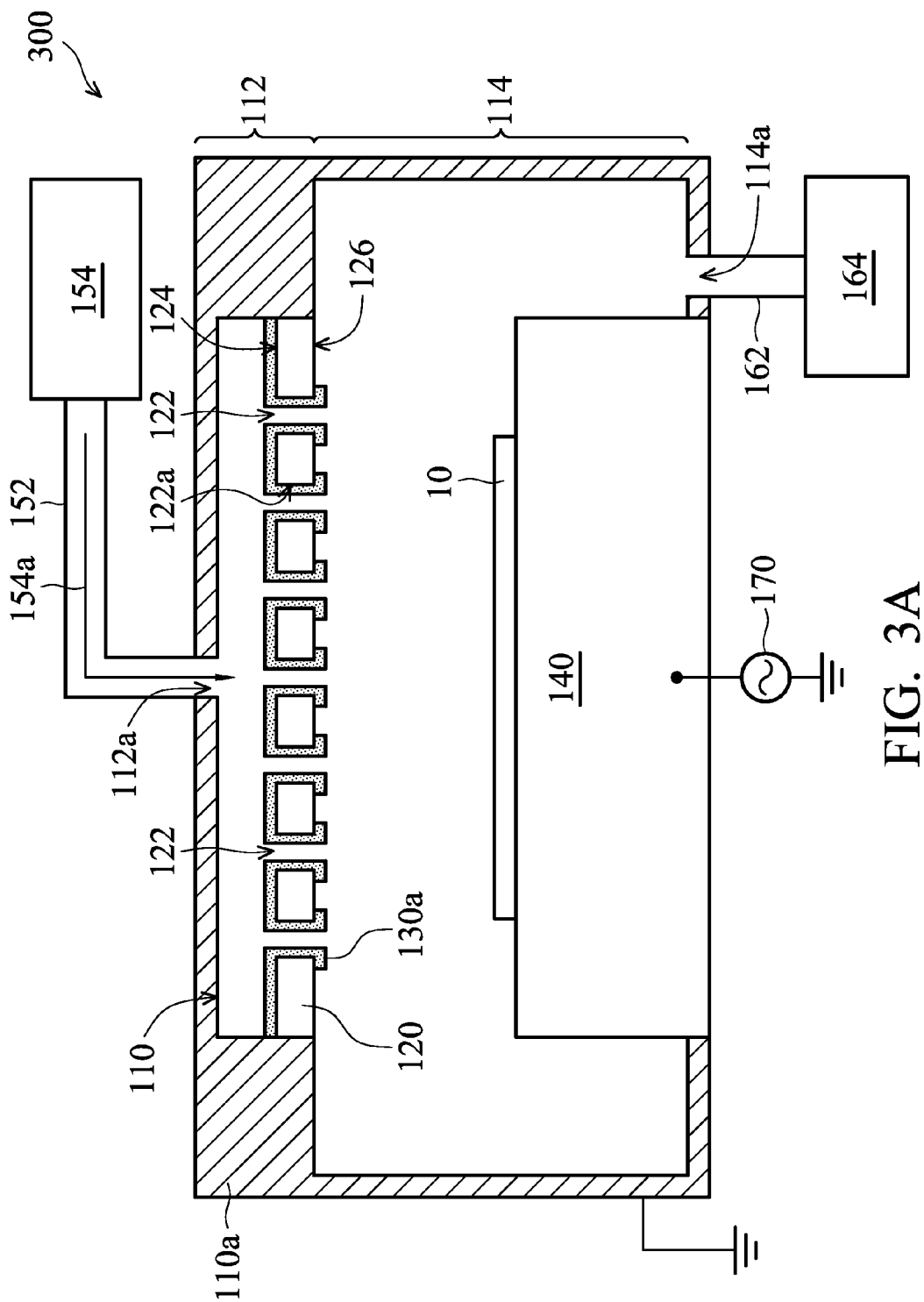
FIG. 3A is a cross-sectional view of a plasma-processing apparatus, in accordance with some embodiments.
Figure 3B:
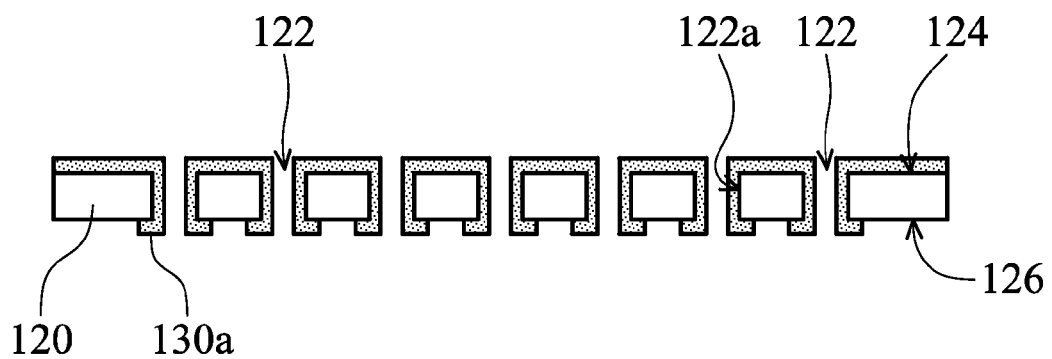
FIG. 3B is an enlarged cross-sectional view of the upper electrode plate and the protective layer of FIG. 3A, in accordance with some embodiments.

FIG. 3A is a cross-sectional view of a plasma-processing apparatus 300, in accordance with some embodiments. FIG. 3B is an enlarged cross-sectional view of the upper electrode plate 120 and the protective layer 130a of FIG. 3A, in accordance with some embodiments.

As shown in FIGS. 3A and 3B, the plasma-processing apparatus 300 is similar to the plasma-processing apparatus 100 of FIG. 1A, except that the protective layer 130a of the plasma-processing apparatus 300 further covers substantially the entirety of the first surface 124, in accordance with some embodiments. Therefore, the protective layer 130a may protect the entire first surface 124 from being damaged by the processing gas 154a. In some embodiments, the protective layer 130a extends onto a portion of the second surface 126.

Figure 4A:
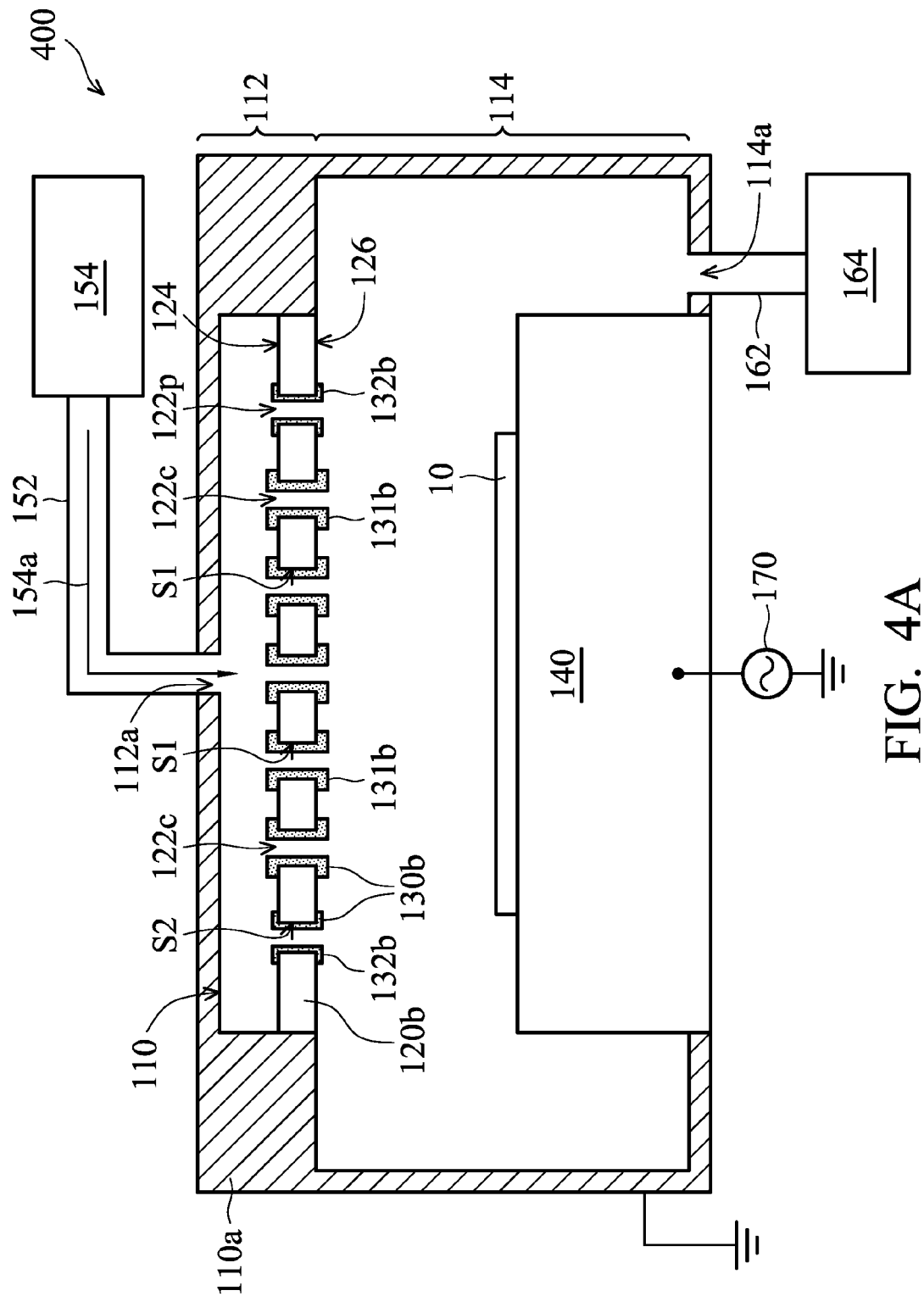
FIG. 4A is a cross-sectional view of a plasma-processing apparatus, in accordance with some embodiments.
Figure 4B:
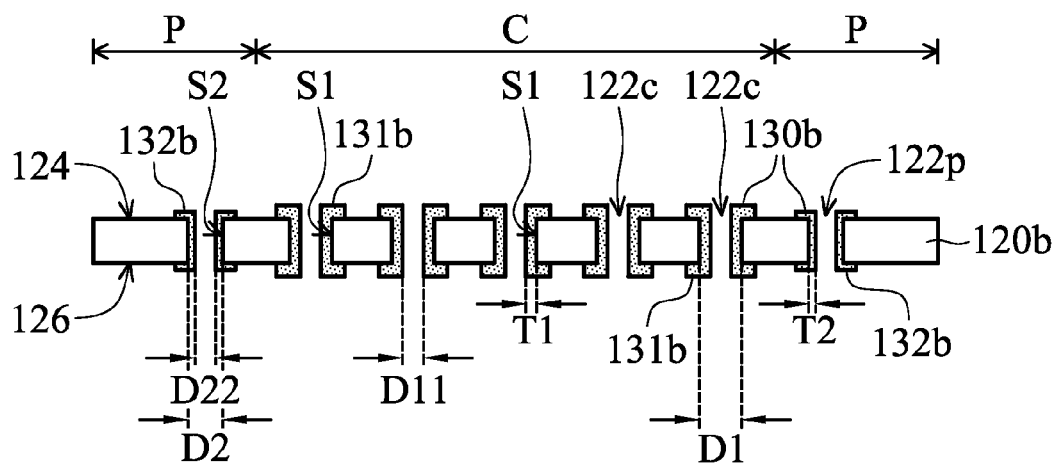
FIG. 4B is an enlarged cross-sectional view of the upper electrode plate and the protective layer of FIG. 4A, in accordance with some embodiments.
Figure 4C:
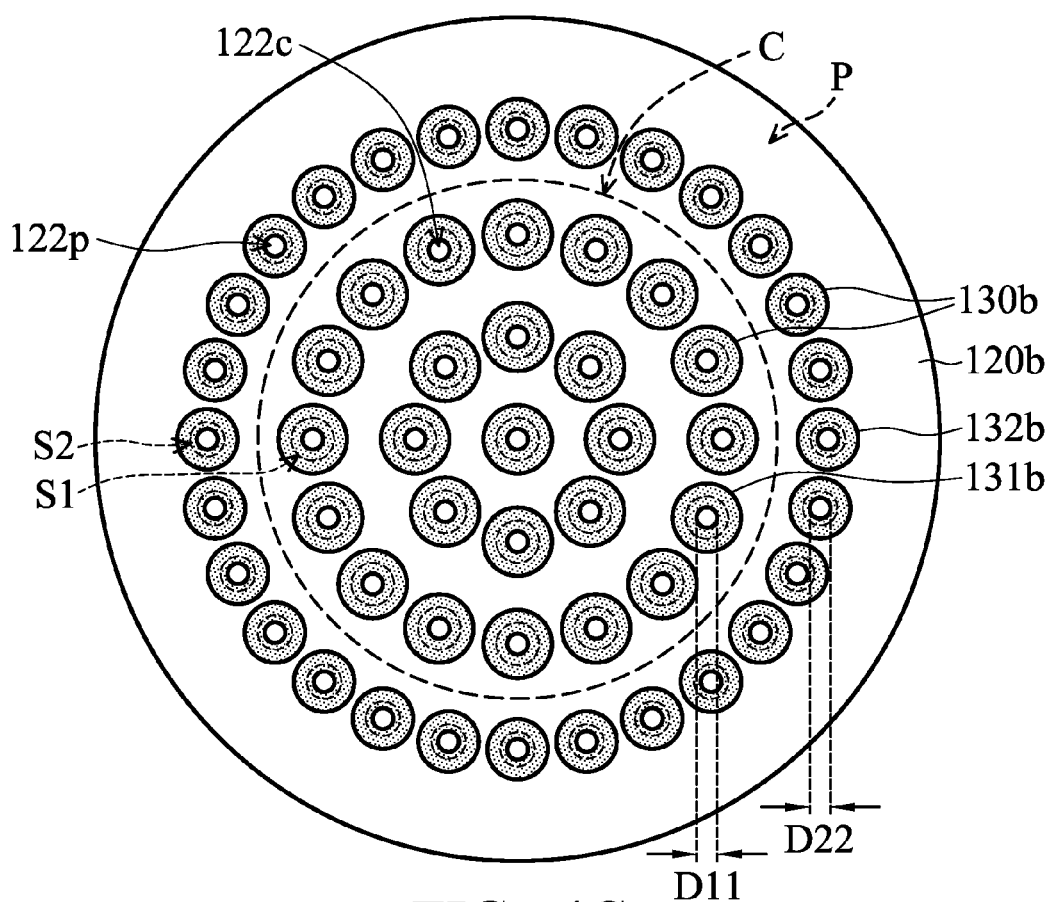
FIG. 4C is a bottom view of the upper electrode plate and the protective layer of FIG. 4A, in accordance with some embodiments.

FIG. 4A is a cross-sectional view of a plasma-processing apparatus 400, in accordance with some embodiments. FIG. 4B is an enlarged cross-sectional view of the upper electrode plate 120b and the protective layer 130b of FIG. 4A, in accordance with some embodiments. FIG. 4C is a bottom view of the upper electrode plate 120b and the protective layer 130b of FIG. 4A, in accordance with some embodiments.

As shown in FIGS. 4A, 4B and 4C, the plasma-processing apparatus 400 is similar to the plasma-processing apparatus 100 of FIG. 1A, and the difference between the plasma-processing apparatuses 100 and 400 is described as follows.

The upper electrode plate 120b of the plasma-processing apparatus 400 has a central portion C and a peripheral portion P surrounding the central portion C, in accordance with some embodiments. The protective layer 130b has a first portion 131b and a second portion 132b, in accordance with some embodiments. The first portion 131b is located over the central portion C, and the second portion 132b is located over the peripheral portion P, in accordance with some embodiments.

The upper electrode plate 120b has gas holes 122c and 122p, in accordance with some embodiments. The gas holes 122c pass through the central portion C, and the gas holes 122p pass through the peripheral portion P, in accordance with some embodiments.

The central portion C may be more easily damaged than the peripheral portion P. Therefore, a first thickness T1 of the first portion 131b is greater than a second thickness T2 of the second portion 132b to strengthen the protection of the central portion C, in accordance with some embodiments.

In some embodiments, the first portion 131b of the protective layer 130b over the inner wall S1 has a cylindrical shape and therefore has an inside diameter D11. In some embodiments, the second portion 132b of the protective layer 130b over the inner wall S2 has a cylindrical shape and therefore has an inside diameter D22. The inside diameter D11 is designed to be equal to the inside diameter D22 such that the processing gas may uniformly pass through the gas holes 122p and 122c.

Therefore, the first diameter D1 of the gas hole 122c is greater than the second diameter D2 of the gas hole 122p due to the fact that the first thickness T1 is greater than the second thickness T2, in accordance with some embodiments. The difference between the first diameter D1 and the second diameter D2 is substantially equal to two times the difference between the first thickness T1 and the second thickness T2, in accordance with some embodiments.

Figure 5A:
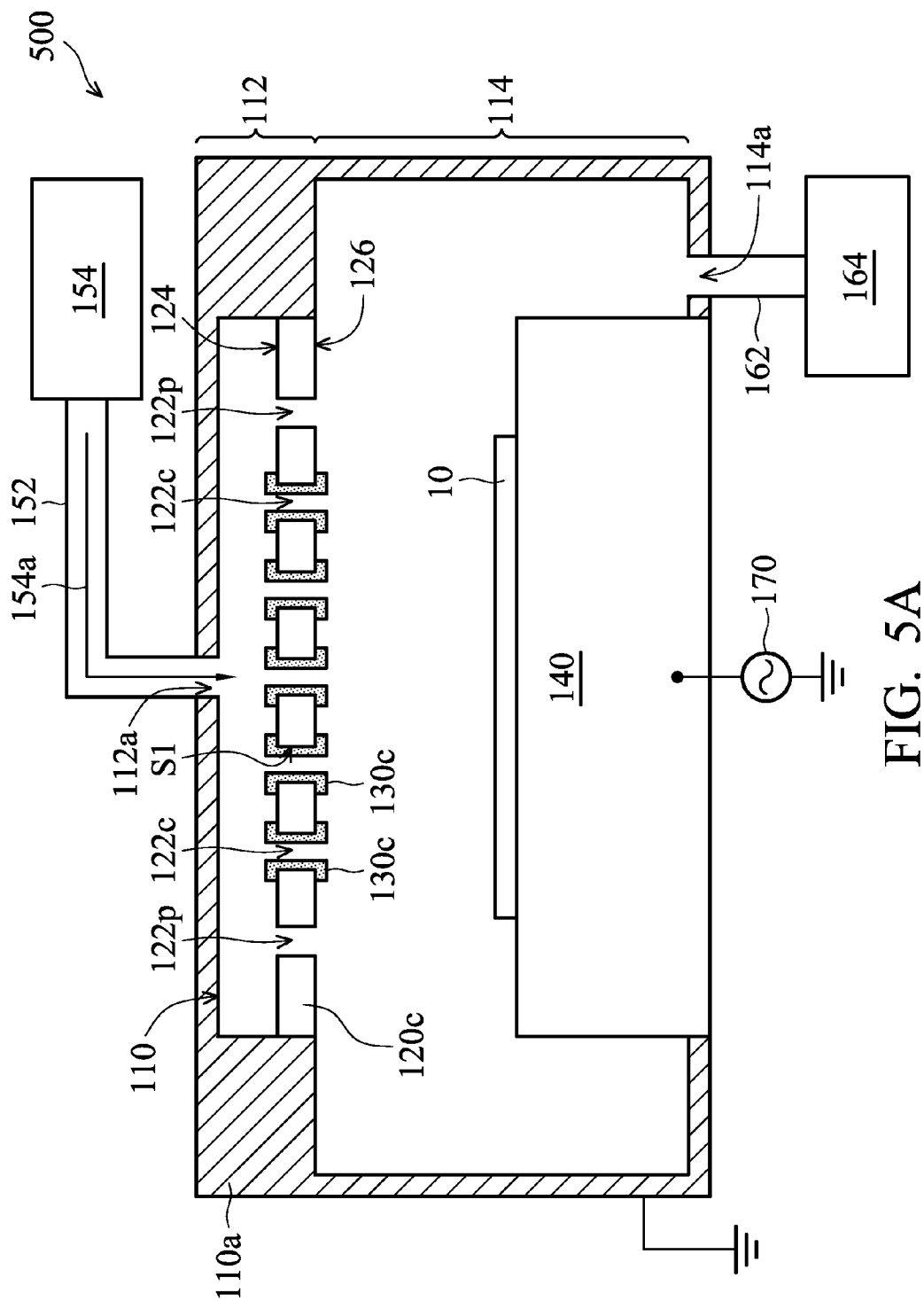
FIG. 5A is a cross-sectional view of a plasma-processing apparatus, in accordance with some embodiments.
Figure 5B:
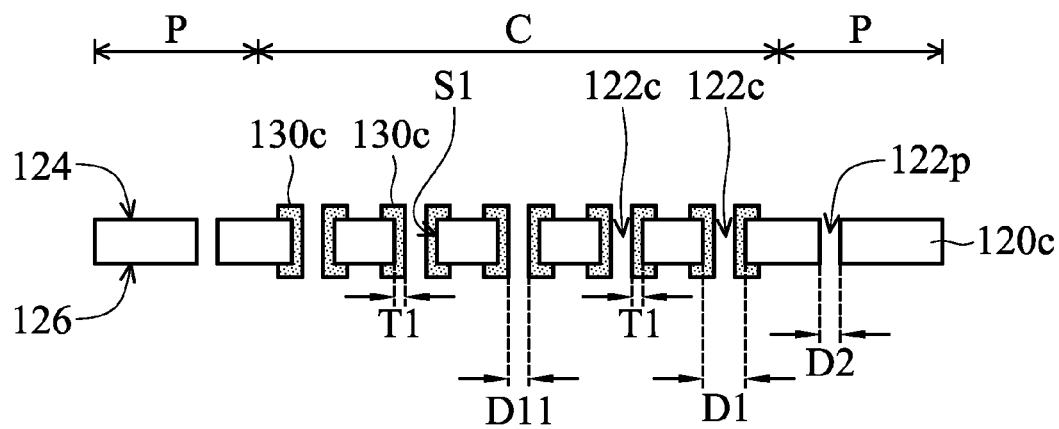
FIG. 5B is an enlarged cross-sectional view of the upper electrode plate and the protective layer of FIG. 5A, in accordance with some embodiments.
Figure 5C:
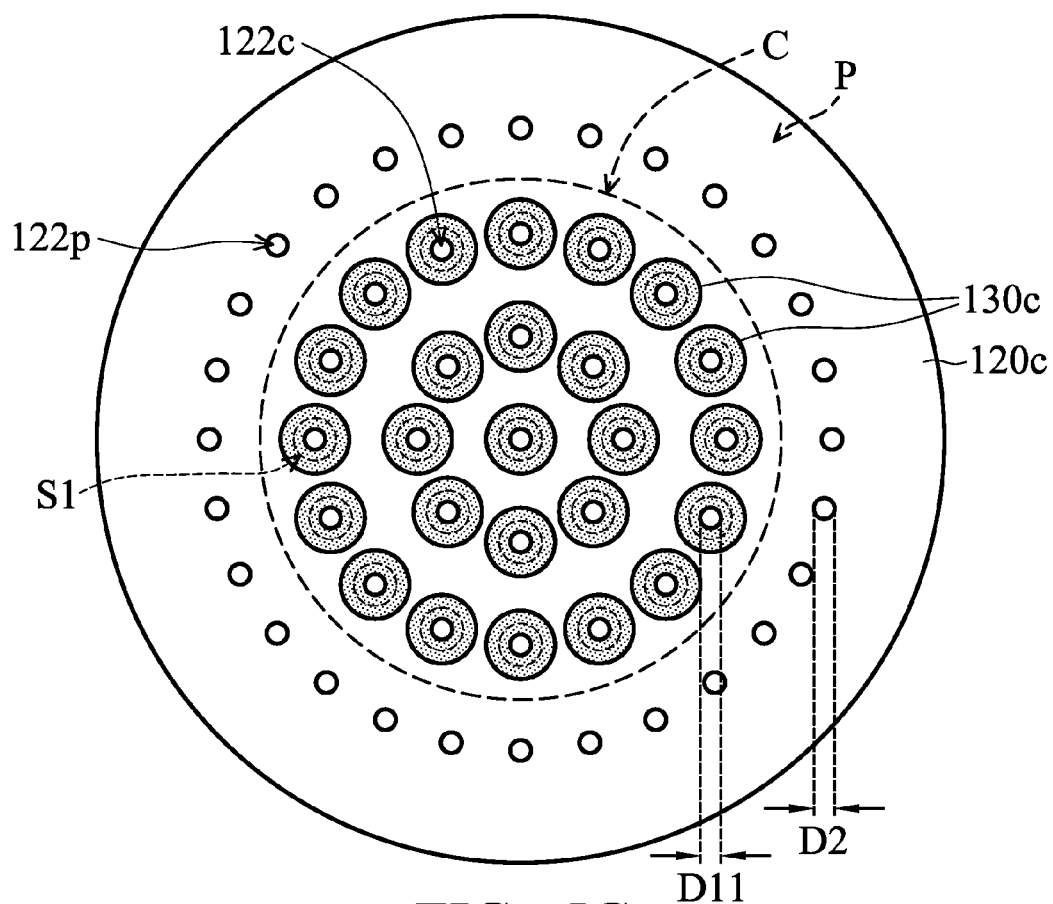
FIG. 5C is a bottom view of the upper electrode plate and the protective layer of FIG. 5A, in accordance with some embodiments.

FIG. 5A is a cross-sectional view of a plasma-processing apparatus 500, in accordance with some embodiments. FIG. 5B is an enlarged cross-sectional view of the upper electrode plate 120c and the protective layer 130c of FIG. 5A, in accordance with some embodiments. FIG. 5C is a bottom view of the upper electrode plate 120c and the protective layer 130c of FIG. 5A, in accordance with some embodiments.

As shown in FIGS. 5A, 5B and 5C, the plasma-processing apparatus 500 is similar to the plasma-processing apparatus 400 of FIG. 4, and the difference between the plasma-processing apparatuses 500 and 400 is described as follows.

The upper electrode plate 120c has a central portion C and a peripheral portion P surrounding the central portion C, in accordance with some embodiments. The protective layer 130c is similar to the protective layer 130b of FIG. 4A, except that the protective layer 130c is disposed over only the central portion C, in accordance with some embodiments.

The inside diameter D11 of the protective layer 130c over the inner wall S1 of the gas hole 122c is equal to the second diameter D2 of the gas hole 122p such that the processing gas may uniformly pass through the gas holes 122c and 122p. Therefore, the first diameter D1 of the gas hole 122c is greater than the second diameter D2 of the gas hole 122p, in accordance with some embodiments. The difference between the first diameter D1 and the second diameter D2 is substantially equal to two times the first thickness T1, in accordance with some embodiments.

In accordance with some embodiments, a plasma-processing apparatus is provided. The plasma-processing apparatus has a protective layer formed over the inner walls of gas holes of an upper electrode plate to prevent the gas holes from being enlarged by a processing gas or plasma of the processing gas. Therefore, the protective layer may improve the yield of etching processes and reduce lot-to-lot CD variation. Furthermore, the protective layer may improve the lifetime of the upper electrode plate.

In accordance with some embodiments, a plasma-processing apparatus is provided. The plasma-processing apparatus includes a processing chamber having an upper portion and a lower portion. The upper portion has a gas inlet. The plasma-processing apparatus includes an upper electrode plate disposed in the upper portion. The upper electrode plate has gas holes passing through the upper electrode plate. The plasma-processing apparatus includes a protective layer disposed over inner walls of the gas holes. The protective layer and the upper electrode plate have different materials. The plasma-processing apparatus includes a lower electrode pedestal disposed in the lower portion for supporting a substrate.

In accordance with some embodiments, a plasma-processing apparatus is provided. The plasma-processing apparatus includes a processing chamber having an upper portion and a lower portion. The upper portion has a gas inlet. The plasma-processing apparatus includes an upper electrode plate disposed in the upper portion. The upper electrode plate has a central portion and a peripheral portion surrounding the central portion. The upper electrode plate has first gas holes passing through the central portion and second gas holes passing through the peripheral portion. The plasma-processing apparatus includes a protective layer disposed over inner walls of the first gas holes. The plasma-processing apparatus includes a lower electrode pedestal disposed in the lower portion for supporting a substrate.

In accordance with some embodiments, a method for performing a plasma treatment process is provided. The method includes introducing a processing gas into a lower portion of a processing chamber through gas holes of an upper electrode plate. A protective layer is disposed over inner walls of the gas holes, and the protective layer and the upper electrode plate are made of different materials. The method includes converting the processing gas to plasma over a substrate in the lower portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A plasma-processing apparatus, comprising:
   a processing chamber having an upper portion and a lower portion, wherein the upper portion has a gas inlet;
   an upper electrode plate disposed in the upper portion, wherein the upper electrode plate has a plurality of gas holes passing through the upper electrode plate;
   a protective layer disposed over inner walls of the gas holes,
   wherein the protective layer and the upper electrode plate comprise different materials, the upper electrode plate has an upper surface and a lower surface, and the protective layer exposes a first portion of the upper surface and a second portion of the lower surface; and
   a lower electrode pedestal disposed in the lower portion for supporting a substrate.

2. The plasma-processing apparatus as claimed in claim 1, wherein the protective layer covers third portions of the upper surface and fourth portions of the lower surface.

3. The plasma-processing apparatus as claimed in claim 1, wherein the upper electrode plate has a central portion and a peripheral portion surrounding the central portion, and the protective layer has a third portion over the central portion and a fourth portion over the peripheral portion, and the third portion is thicker than the fourth portion.

4. The plasma-processing apparatus as claimed in claim 3, wherein a first diameter of the gas hole passing through the central portion is greater than a second diameter of the gas hole passing through the peripheral portion.

5. The plasma-processing apparatus as claimed in claim 1, wherein the protective layer comprises oxides, nitrides, carbides, or ceramic materials.

6. The plasma-processing apparatus as claimed in claim 5, wherein the protective layer comprises yttrium oxide, aluminum oxide, silicon nitride, or silicon carbide.

7. The plasma-processing apparatus as claimed in claim 1, wherein the gas holes comprise a first gas hole and a second gas hole, the protective layer has a third portion and a fourth portion, the third portion covers a first inner wall of the first gas hole, the fourth portion covers a second inner wall of the second gas hole, and the third portion and the fourth portion are separated from each other.

8. The plasma-processing apparatus as claimed in claim 1, wherein the upper electrode plate comprises silicon or quartz.

9. The plasma-processing apparatus as claimed in claim 1, wherein the first portion of the upper surface and the second portion of the lower surface are located between the gas holes.

10. A plasma-processing apparatus, comprising:
    a processing chamber having an upper portion and a lower portion, wherein the upper portion has a gas inlet;
    an upper electrode plate disposed in the upper portion, wherein the upper electrode plate has a central portion and a peripheral portion surrounding the central portion, the upper electrode plate has a plurality of first gas holes passing through the central portion and a plurality of second gas holes passing through the peripheral portion, and a first diameter of the first gas hole is greater than a second diameter of the second gas hole;
    a protective layer disposed over inner walls of the first gas holes; and
    a lower electrode pedestal disposed in the lower portion for supporting a substrate.

11. The plasma-processing apparatus as claimed in claim 10, wherein the upper electrode plate has an upper surface and a lower surface, and the protective layer exposes a first portion of the upper surface and a second portion of the lower surface.

12. The plasma-processing apparatus as claimed in claim 11, wherein a difference between the first diameter and the second diameter is substantially equal to two times a thickness of the protective layer.

13. The plasma-processing apparatus as claimed in claim 10, wherein the protective layer comprises oxides, nitrides, carbides, or ceramic materials.

14. The plasma-processing apparatus as claimed in claim 13, wherein the protective layer comprises yttrium oxide, aluminum oxide, silicon nitride, or silicon carbide.

15. The plasma-processing apparatus as claimed in claim 10, wherein the upper electrode plate has a first surface and a second surface opposite to the first surface, and the protective layer extends onto portions of the first surface and the second surface.

16. The plasma-processing apparatus as claimed in claim 10, wherein the upper electrode plate comprises silicon or quartz.

17. A method for performing a plasma treatment process, comprising:
    introducing a processing gas into a lower portion of a processing chamber through a plurality of gas holes of an upper electrode plate, wherein a protective layer is disposed over inner walls of the gas holes, and the protective layer and the upper electrode plate are made of different materials, the upper electrode plate has an upper surface and a lower surface, and the protective layer exposes a first portion of the upper surface and a second portion of the lower surface; and converting the processing gas to plasma over a substrate in the lower portion.

18. The method for performing a plasma treatment process as claimed in claim 17, wherein the conversion of the processing gas to the plasma comprises:

converting the processing gas to the plasma by a high frequency discharge generated between the upper electrode plate and a lower electrode pedestal in the lower portion, wherein the substrate is located between the upper electrode plate and the lower electrode pedestal.

19. The method for performing a plasma treatment process as claimed in claim 17, wherein the processing gas comprises tetrafluoromethane.

20. The method for performing a plasma treatment process as claimed in claim 17, wherein the protective layer comprises yttrium oxide, aluminum oxide, silicon nitride, or silicon carbide.

\* \* \* \* \*